US007701119B2

(12) United States Patent
Onishi et al.

(10) Patent No.: US 7,701,119 B2
(45) Date of Patent: Apr. 20, 2010

(54) PIEZOELECTRIC ACTUATOR

(75) Inventors: Yasuharu Onishi, Minatu-ku (JP); Yasuhiro Sasaki, Minato-ku (JP); Nozomi Toki, Minato-ku (JP)

(73) Assignee: NEC Corporation, Tokyo (JP)

( * ) Notice: Subject to any disclaimer, the term of this patent is extended or adjusted under 35 U.S.C. 154(b) by 22 days.

(21) Appl. No.: 10/562,578

(22) PCT Filed: Dec. 3, 2004

(86) PCT No.: PCT/JP2004/018002

§ 371 (c)(1),
(2), (4) Date: Dec. 27, 2005

(87) PCT Pub. No.: WO2005/067346

PCT Pub. Date: Jul. 21, 2005

(65) Prior Publication Data

US 2006/0159295 A1 Jul. 20, 2006

(30) Foreign Application Priority Data

Dec. 26, 2003 (JP) ............................ 2003-432456

(51) Int. Cl.
*H01L 41/053* (2006.01)
*H02N 2/04* (2006.01)

(52) U.S. Cl. ........................ 310/328; 310/330; 310/345

(58) Field of Classification Search ................. 310/311, 310/322, 324, 328, 334, 321, 330, 345
See application file for complete search history.

(56) References Cited

U.S. PATENT DOCUMENTS 4,140,936 A * 2/1979 Bullock ...................... 310/328
5,153,859 A * 10/1992 Chatigny et al. ............ 367/140
5,856,956 A * 1/1999 Toki .......................... 367/160
6,359,370 B1 * 3/2002 Chang ........................ 310/328
6,453,050 B1 * 9/2002 Ogura et al. ................ 381/190
7,067,965 B2 * 6/2006 Sasaki et al. ................ 310/358
2002/0149296 A1 * 10/2002 Fujii et al. .................. 310/328

FOREIGN PATENT DOCUMENTS

CN 2155645 Y 2/1994
JP 9-18065 A 1/1997
JP 10-94093 A 4/1998
JP 10-210768 A 8/1998
JP 11-69491 A 3/1999

(Continued)

*Primary Examiner*—Walter Benson
*Assistant Examiner*—Derek J Rosenau
(74) *Attorney, Agent, or Firm*—Sughrue Mion, PLLC

(57) ABSTRACT

A piezo-electric actuator comprising: piezo-electric element 1*a* having piezo-electric body 3*a* which is provided with at least two opposing surfaces, wherein the surfaces perform an expanding and contracting motion in accordance with the state of an electric field; a constraint member 21*a* for constraining piezo-electric element 1*a* on at least one of the two surfaces, a supporting member disposed around constraint member 21*a*, and a plurality of beam members 22*a* each having both ends fixed to constraint member 21*a* and supporting member 4*a*, respectively, wherein each beam member has a neutral axis for bending in a direction substantially parallel with the constrained surface, wherein the constraint member vibrates by vibration which is generated by the constraining effect between the constraint member and the piezo-electric element, and is amplified by the beam members.

14 Claims, 15 Drawing Sheets

FOREIGN PATENT DOCUMENTS

| | | | |
|---|---|---|---|
| JP | 11-155184 | A | 6/1999 |
| JP | 2000-140759 | A | 5/2000 |
| JP | 2000-332313 | A | 11/2000 |
| JP | 2000-350292 | A | 12/2000 |
| JP | 2001-16692 | A | 1/2001 |
| JP | 2001-17917 | A | 1/2001 |
| JP | 2001-339791 | A | 12/2001 |
| JP | 2002-252989 | A | 9/2002 |
| JP | 2003-125473 | A | 4/2003 |

* cited by examiner

Fig. 1A - PRIOR ART
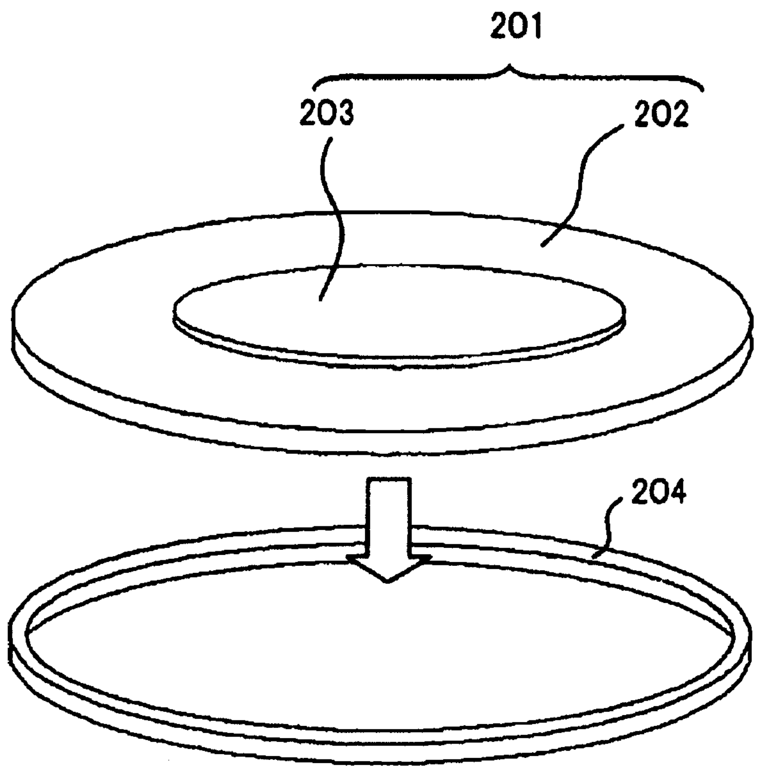
Fig. 1B - PRIOR ART
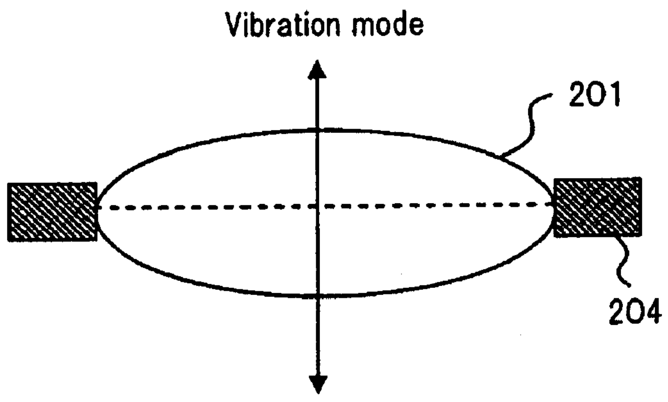

PIEZOELECTRIC ACTUATOR

TECHNICAL FIELD

The present invention relates to a small-size piezo-electric actuator which is used in electronic devices.

BACKGROUND ART

Electromagnetic actuators have been generally utilized as driver components for acoustic elements such as speakers, due to their easy handling. An electromagnetic actuator comprises a permanent magnet, a voice coil, and a diaphragm, and causes a low-stiffness diaphragm that is made of an organic film and is fixed to the coil to vibrate, through the operation of a magnetic circuit in a stator which uses the magnet. Therefore, they present a reciprocal vibration mode and can provide large vibration amplitude.

By the way, the demand for power-saving actuators has been increasing, together with an increased demand for cellular phones and personal computers in recent years. However, electromagnetic actuators have the problem that the reduction in power consumption is difficult due to the large amount of current which flows in the voice coil to generate magnetic force. Further, despite the need for a reduction in size of actuators for mounting in a cellular phone or a personal computer, it is difficult to reduce the thickness due to its configuration, because, if a permanent magnet in an electromagnetic actuator, which is one of the components of the actuator, is reduced in thickness, orientation of the magnetic poles will not align, causing failure in ensuring stable a magnetic field, and thus resulting in difficulties in controlling the synchronization of the vibrating film and the voice coil. Further, magnetic flux may leak from the voice coil and may induce malfunctions in other electronic components which constitute the electronic device. Thus, an electromagnetic shield is required when applying the actuator to an electronic device. However, this shield requires a large space. For this reason as well, an electromagnetic actuator is not suitable for use in small devices such as a cellular phone. Additionally, there is the problem that if a voice coil is made of thinner wire, and has increased resistance, the voice coil may be burnt due to the large amount of current, which features the electromagnetic acoustic element, to drive the coil.

Thus, a piezo-electric actuator which employs a piezo-electric element as a driver component, having such features as small size, light weight, low power consumption, no leakage of magnetic flux, and so on, is desired as a thin vibration element, instead of an electromagnetic type vibration element. A piezo-electric actuator generates vibration through the expanding and contracting motion or the bending motion of a piezo-electric element that is in the shape of a thin plate. A piezo-electric actuator is fabricated by bonding a piezo-electric ceramic element to a base, as disclosed in the specification of Japanese Patent Laid-open Publication No. 168971/86.

An example of a conventional piezo-electric actuator is illustrated in FIGS. 1A, 1B. FIG. 1A illustrates an exploded perspective view of a piezo-electric actuator. Piezo-electric body 203 made of piezo-electric ceramics is fixed to the central region of circular base 202 to form piezo-electric element 201. The outer periphery of base 202 is supported by circular supporting member 204. As a predetermined AC voltage is applied to piezo-electric body 203, piezo-electric body 203 performs an expanding and contracting motion. A bending motion is induced in base 202 in an out-of-plane direction to generate vibration through the constraining effect of the fixed portion between piezo-electric body 203 and base 202. As illustrated in FIG. 1B, base 202 vibrates in an out-of-plane direction, with supporting member 204 fixed (as node) and the central portion moving as an antinode.

By the way, because a piezo-electric ceramic has high stiffness, a piezo-electric actuator has the problem that it vibrates only in small average amplitude as compared with an electromagnetic actuator. In particular, a piezo-electric actuator, which is fixed along its periphery and which has an arc-shaped vibration mode in which the central portion deforms dominantly, deforms only in small amplitude on average, making it even more difficult to achieve sufficient amplitude of vibration. Further, due to the high stiffness of the piezo-electric ceramic, the amplitude of vibration varies significantly around the resonance frequency, so that it is difficult to achieve vibration amplitude having flat frequency characteristic.

Further, the resonance frequency of the piezo-electric actuator largely depends on its shape. When a piezo-electric actuator is applied to low frequency acoustic components such as a loud speaker, the piezo-electric ceramic element must be either enlarged in area or extremely reduced in thickness in order to lower the resonance frequency. However, due to the brittleness of the ceramic material, enlargement in area or reduction in thickness may causes deterioration in reliability such as cracking during handling, breakage due to dropping, and the like. This makes the piezo-electric actuator unsuitable for practical use in many cases.

Additionally, when the actuator is applied to an electronic device, due to the large vibration reaction force of a piezo-electric ceramic, vibration tends to propagate to a housing, which contains the piezo-electric actuator, through support members. This leakage of vibration may cause the disadvantage that the housing generates abnormal sound.

Thus, to address the foregoing problems, the specification of Japanese Patent Laid-open Publication No. 2000-140759 discloses a technique in which a vibrator having a piezo-electric ceramic and a base is supported by springs along the periphery of the housing. The resonance frequency of the spring structure is set at near the resonance frequency of the vibrator. Since a large amount of energy is carried in the spring structure, large amplitude of vibration can be obtained.

For similar purposes, the specification of Japanese Patent Laid-open Publication No. 2001-17917 discloses a technique in which slits are provided in the peripheral region of a base along its circumference to form leaf springs in order to provide a similar function.

DISCLOSURE OF THE INVENTION

According to the technique disclosed in the specification of Japanese Patent Laid-open Publication No. 2000-140759, displacement of the vibration of the piezo-electric body is largely increased. However, since springs have to be arranged in a direction perpendicular to the plane of the vibrator to allow perpendicular movement of the vibrator, the thickness of the piezo-electric actuator is increased. Therefore, this technique is less suitable for a reduction in thickness. Further, since springs and a diaphragm are inserted in the housing according to the configuration in this patent document, it is very difficult to arrange the diaphragm at an optimal position.

On the other hand, in the technique disclosed in the specification of Japanese Patent Laid-open Publication No. 2001-17917, it is necessary that a circular base is combined with circular piezo-electric ceramic or rectangular piezo-electric ceramic, because it is difficult to form leaf springs if the base is substantially not circular. In the former case, since the piezo-electric ceramic has to be machined into a circular shape, the fabrication steps and the cost will increase because of machining the ceramic into a circular shape, and because forming the larger extra portion in advance worsens yield rate, etc. On the other hand, in the latter case, since the piezo-electric ceramic cannot be arranged on the peripheral region of the base in an effective fashion, vibration does not transmit efficiently to the base, making it difficult to obtain sufficient vibration displacement. Further, in both cases, slits that are formed on a disk to form leaf springs induce rotational motion in the support member for the piezo-electric ceramic during operation. This causes distortion in sound when a vibratory film is attached for use as an acoustic element.

In view of the foregoing situations, it is an object of the present invention to provide a small and thin piezo-electric actuator which is capable of generating vibration at a large amplitude, is adjustable for resonance frequency, is provided with high reliability, and is applicable to electronic devices, without causing an increase in dimensions.

To solve the aforementioned problems, a piezo-electric actuator of the present invention has a piezo-electric element having a piezo-electric body with at least two opposing surfaces which perform expanding and contracting motions in accordance with the state of an electric field, a constraint member for constraining the piezo-electric element on at least one of the two surfaces, a supporting member disposed around the constraint member, and a plurality of beam members each having both ends that are fixed to the constraint member and the supporting member, respectively, and each having a neutral axis for bending in a direction substantially parallel with the constrained surface.

In the piezo-electric actuator thus configured, vibration is caused by the constraining effect between the constraint member and the piezo-electric element, and is amplified by the beam members. Then the constraint member vibrates. Specifically, if vibration is induced at a resonance frequency, which is determined by physical properties, shape, number of constraint member, weight of the piezo-electric body, etc., the constraint member is significantly displaced, while deformation of the piezo-electric body, which has a limited capacity of deformation, is restricted. Thus, it is possible to cause the entire piezo-electric body to vibrate relative to the supporting members at a large amplitude. Further, the resonance frequency can be easily controlled by adjusting the physical properties (material), number etc. of the constraint member. Accordingly, the present invention can provide a piezo-electric actuator that is thin and small, is capable of generating large vibration amplitude, is adjustable for resonance frequency without changing outer dimensions, and has high reliability.

The beam members may be straight beams. The constraint member may have a base for constraining the piezo-electric element, and a plurality of arms which extend from the base and constitute the beam members.

The constraint member may also be a second piezo-electric element which differs in vibrating direction from the piezo-electric body.

Also, the piezo-electric element may have a plurality of piezo-electric bodies and a plurality of electrode layers for applying an electric field to the piezo-electric bodies, wherein each piezo-electric body and each electrode layer is alternately laminated.

Further, the piezo-electric element may have a rectangular parallelepiped shape.

An acoustic element of the present invention has the piezo-electric actuator described above, and a vibrating film coupled to the piezo-electric actuator for radiating sound by vibration that is transmitted from the piezo-electric actuator.

Also, the acoustic element of the present invention may further have a vibration transmitting member sandwiched between the piezo-electric actuator and the vibrating film.

An electronic device of the present invention has the piezo-electric actuator or acoustic element described above.

An acoustic apparatus of the present invention has a plurality of acoustic elements which have resonance frequencies that are different from each other for smoothing frequency response of sound pressure. Also, an electronic device of the present invention has the acoustic apparatus.

As described above, according to the piezo-electric actuator of the present invention, the entire piezo-electric body vibrates at a large amplitude relative to the supporting members mainly through displacement of the constraint member. Also, the resonance frequency can be easily controlled by adjusting the physical property (material), number etc. of the constraint member. Further, even in case that an electronic device which contains the piezo-electric actuator is dropped, the constraint member, made of an elastic material, can mitigate the impact to the piezo-electric body by absorbing the impact energy. In this way, according to the present invention, a piezo-electric actuator can be provided that is thin and small, is capable of generating large vibration amplitude, is adjustable for resonance frequency without changing outer dimensions, and has high reliability.

BRIEF DESCRIPTION OF THE DRAWINGS

FIG. 1A is an exploded perspective view of a conventional piezo-electric actuator.

FIG. 1B is a conceptual diagram showing a vibration mode of a conventional piezo-electric actuator.

DESCRIPTION OF REFERENCE NUMERALS

1_a_, 1_c_, 1_d_, 1_e_, 1_f_ piezo-electric element
3_a_, 3_d_, 3_e_ piezo-electric body
3_c_ Upper piezo-electric body
3_c_' Lower piezo-electric body
21_a_, 21_b_, 21_f_ base
22_a_, 22_b_, 22_c_ beam member
4_a_, 4_b_, 4_c_ supporting member
31_a_, 31_c_, 31_c_', 31_d_, 31_e_, 31_e_' upper electrode layer
32_a_, 32_c_, 32_c_', 32_e_, 32_e_' lower electrode layer
33_e_ upper insulating layer
33_e_' lower insulating layer
34 vibration film
35 intermediate insulating layer
36 insulating layer

BEST MODE FOR CARRYING OUT THE INVENTION

Figure 2:
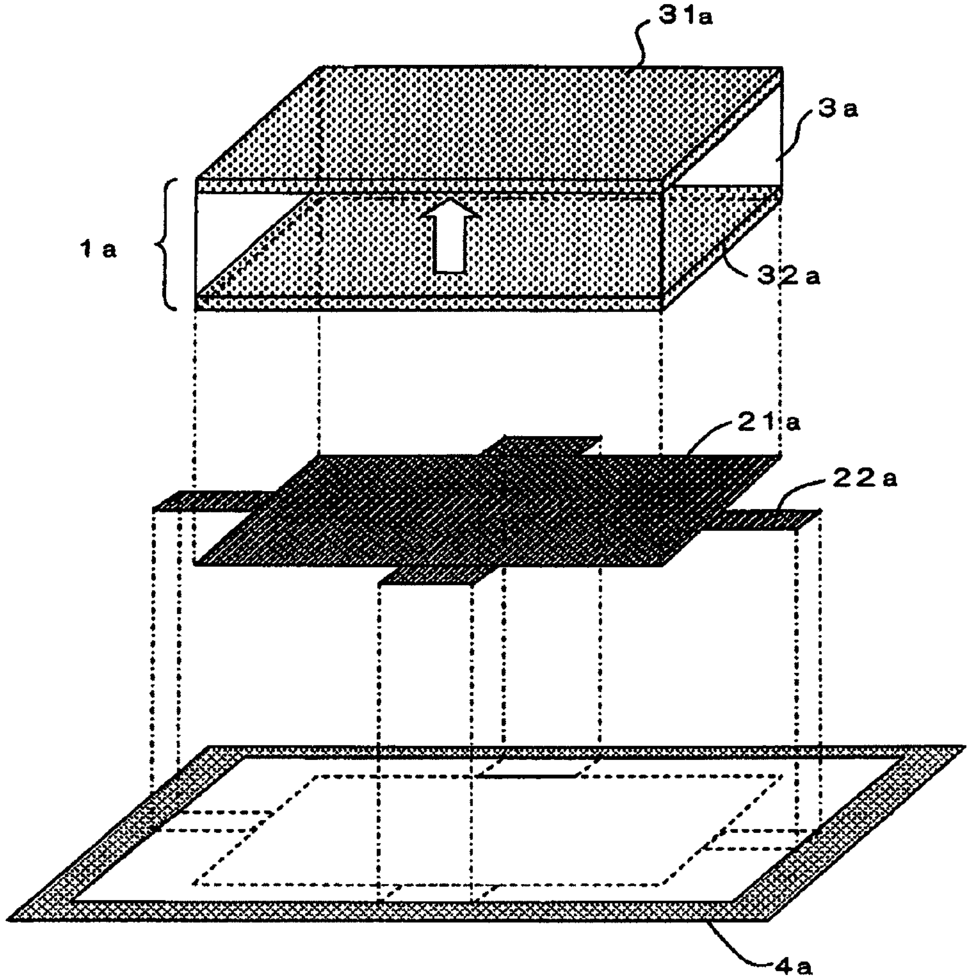
FIG. 2 is an exploded perspective view of a piezo-electric actuator according to a first embodiment of the present invention.

In the following, embodiments of the present invention will be described with reference to the drawings. FIG. 2 is an exploded perspective view of a piezo-electric actuator according to a first embodiment of the present invention. Piezo-electric element 1_a_ has upper electrode layer 31_a_ and lower electrode layer 32_a_ that adhere to the opposing surfaces of piezo-electric body 3_a_ made of ceramic. As an adhesive, an epoxy-based adhesive, for example, may be used. Piezo-electric body 3_a_, which is substantially in a rectangular parallelepiped shape, is polarized in the thickness direction indicated by a white arrow in the figure. Piezo-electric body 3_a_ is fixed to rectangular base 21_a_ via lower electrode layer 32_a_. Specifically, the piezo-electric element has a piezo-electric body which includes at least two opposing surfaces that perform an expanding and contracting motion in accordance with the state of an electric field, and base 21_a_ is a constraint member for constraining the piezo-electric element by at least one of the two surfaces. Base 21_a_ may be made of a variety of materials which have a lower stiffness than ceramic material which constitutes piezo-electric body 3_a_, such as metals including an aluminum alloy, phosphor bronze, titanium, a titanium alloy etc., and such as resins including epoxy, acrylic, polyimide, polycarbonate resin etc. Piezo-electric body 3_a_ need not be in a rectangular parallelepiped shape, but may be in other shapes such as a cylindrical shape, for example, depending on the relationship to the mounting space.

Supporting member 4_a_ provided with a rectangular hole therein is arranged around the periphery of base 21_a_. Beam members 22_a_ connect supporting member 4_a_ and base 21_a_. Beam members 22_a_ extend from each side of base 21_a_ to the opposing side of supporting member 4_a_, with both ends fixed to base 21_a_ and supporting member 4_a_, respectively at the joints. Beam member 22_a_ may be fabricated of a material similar to that of base 21_a_.

Figure 3:
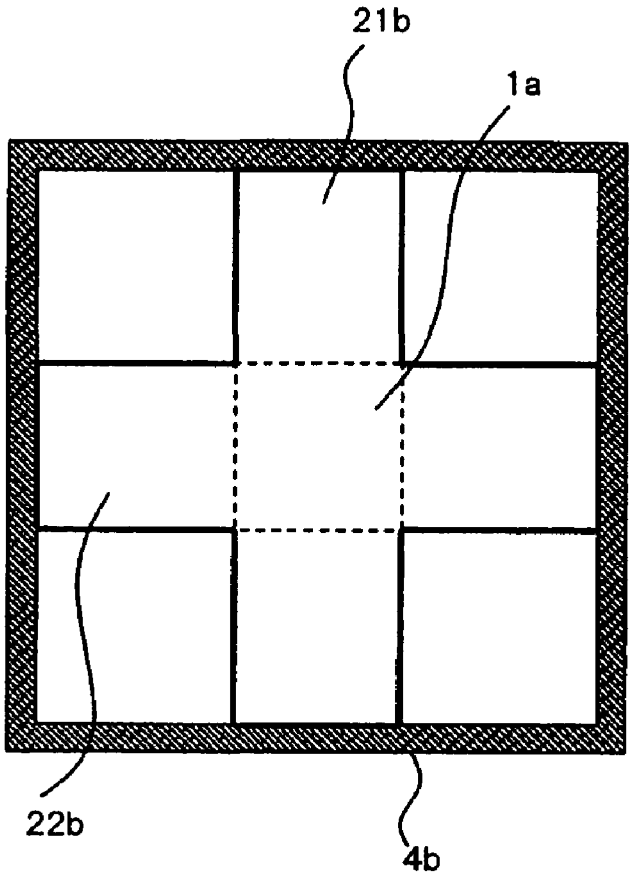
FIG. 3 is a plan view illustrating another embodiment of the base for a piezo-electric actuator.

However, supporting member 4_a_ is not limited to a particular shape. For example, an annular member (see FIG. 12) may be used instead of a rectangular shape with a hole. As another alternative, beam members 22_a_ and base 21_a_ may be integrated without fabricating the members separately. For example, cross-shaped base 21_b_ may be used. As shown in FIG. 3, piezo-electric element la is arranged in the intersecting region, and four straight arms (beam members 22_b_) which surround the region and extend from the respective sides thereof are fixed to surrounding supporting member 4_b_, whereby each arm functions as beam member 22_b_, and similar effects can be obtained. In such a configuration, beam members 22_b_ can be integrally formed as part of base 21_b_ by just cutting away four corners of a rectangular base material, thereby improving productivity of piezo-electric actuators, and reliability as well, because the joints that connect the region for piezo-electric element 1_a_ with beam members 22_b_ are less susceptible to aging deteriorations.

Beam members 22_a_ bend and deform such that entire piezo-electric element 1_a_ vibrates in the out-of-plane direction of base 21_a_. The vibration system consisting of piezo-electric element 1_a_ and beam members 22_a_ has a natural frequency for bending vibration in the out-of-plane direction of base 21_a_, and resonates and vibrates at a natural frequency in the up-and-down direction at a large amplitude. The natural frequency is determined by the physical properties (mainly, Young's modulus), cross-sectional shape, length, and the number of beam members 22_a_, as well as the weights of the base and piezo-electric body 3_a_, and so on. A detailed description will be given next on the mechanism to generate vibration.

First, as an AC electric field is applied to upper electrode layer 31_a_ and lower electrode layer 32_a_ of piezo-electric element 1_a_, piezo-electric element 1_a_ performs an expanding and contracting motion. Specifically, piezo-electric element 1_a_ alternately repeats, in accordance with the orientation of the electric field, a deformation mode in which piezo-electric body 3_a_ is compressed (a deformation mode in which the surfaces, to which upper electrode layer 31_a_ and lower electrode layer 32_a_ are fixed, are expanded, while the height of piezo-electric body 3_a_ (the spacing between upper electrode layer 31_a_ and lower electrode layer 32_a_) is reduced) and a deformation mode in which piezo-electric body 3_a_ elongates in the height direction (a deformation mode in which the surfaces, to which upper electrode layer 31_a_ and lower electrode layer 32_a_ are fixed, are contracted, while the height of piezo-electric body 3_a_ is increased). As a result, when the fixing surfaces expand, the surface of base 21_a_ deforms to bend in a direction opposite to piezo-electric body 3_a_ by the constraint between base 21_a_ and piezo-electric body 3_a_. Conversely, when the fixing surfaces contract, the surface of base 21_a_ deforms to bend towards piezo-electric body 3_a_. With these motions, the peripheral edge of base 21_a_ vibrates up and down, which motions are transmitted to a plurality of beam members 22_a_ attached to base 21_a_. Since beam members 22_a_ are fixed to supporting member 4_a_ beam members 22_a_ and piezo-electric element 1*a*, supported by beam members 22*a*, vibrate in the up-and-down direction at a large amplitude about fixed supporting member 4*a*.

Figure 4:
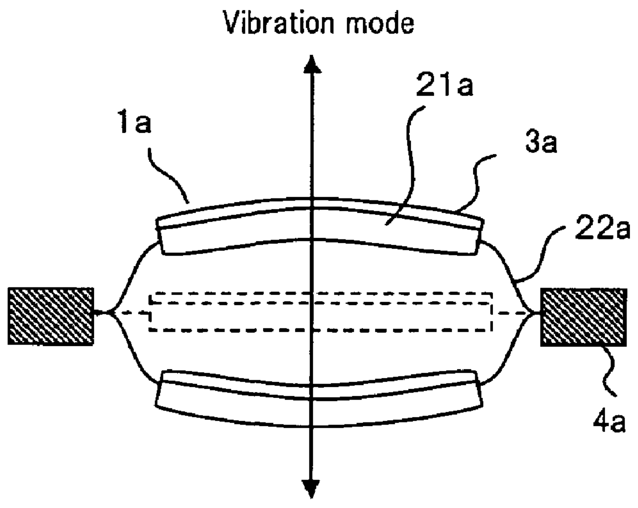
FIG. 4 is a conceptual diagram showing a vibration mode of the piezo-electric actuator illustrated in FIG. 2.

FIG. 4 conceptually illustrates the vibration mode of the piezo-electric actuator. Since the deformation of beam members 22*a* is relatively large, while the deformation of piezo-electric body 3*a* is relatively small, the resulting vibration mode presents a piston type, rather than an arc-shaped vibration mode as illustrated in FIG. 1B. In this way, a large reciprocal movement of piezo-electric element 1*a* in the vertical direction can be induced without causing large deformation or distortion in piezo-electric body 3*a*.

The piezo-electric actuator of the present invention further has the following advantages.

First, the vibration characteristics of the piezo-electric actuator of the present invention can be easily adjusted by changing the material characteristics, the number, the width, and the length etc. of beam members 22*a*. Therefore, when a piezo-electric actuator having different vibration characteristics is fabricated, the resonance frequency can be easily changed simply by modifying beam members 22*a*, without changing the outer dimensions. Further, the standardization and the common use of the elements in a wider range contribute to a reduction in cost as well.

Secondly, since there is less limitation for the configuration of piezo-electric element 3*a* and supporting member 4*a*, the piezo-electric actuator of the present invention excels at being adaptable to the space of a device in which the piezo-electric actuator is installed. Particularly, the piezo-electric actuator of the present invention excels in productivity, as compared to a piezo-electric actuator with a circular piezo-electric element, because the piezo-electric actuator of the present invention utilizes piezo-electric element 3*a* in a rectangular shape, and thus base 21*a* and beam members 22*a* can be formed in simple shapes as well.

Thirdly, since the resonance frequency of the piezo-electric actuator can be lowered without significantly reducing the thickness of an expensive piezo-electric element, the strength of the piezo-electric element can be readily ensured. Further, the conventional piezo-electric actuator is susceptible to breakage such as cracks due to impact distortion that the ceramic part receives when an electronic device which contains the piezo-electric actuator is dropped, whereas, in the present invention, the impact distortion to the ceramic portion can be avoided because the impact distortion is absorbed mainly by beam members 22*a*, resulting in higher mechanical reliability. Because of these advantages, low-frequency acoustic elements can be easily produced at a low cost.

Fourthly, since beam members 22*a* are completely bonded and fixed to supporting member 4*a*, the joints serve as vibration nodes when the piezo-electric actuator vibrates. Consequently, the vibration is less apt to propagate from the piezo-electric actuator toward an electronic device through the joints, resulting in higher reliability with less possibility of fatigue fracture and generation of abnormal sound due to vibration of the joints.

As described above, according to the present invention, a piezo-electric actuator can be provided which has a simple structure, high reliability and productivity as well as the capability of easily generating vibration at a large amplitude.

Additionally, application of the piezo-electric actuator of the present invention is not limited to cellular phones. The piezo-electric actuator of the present invention, for example, can provide functional components such as camera modules with a highly accurate zooming function and a focus adjusting function against hand shaking and so on by adjusting the displacement or the vibration amplitude by the amount of electricity applied to the piezo-electric actuator. Accordingly, the industrial value of electronic devices which contain the piezo-electric actuator of the present invention will be enhanced as well.

Figure 5:
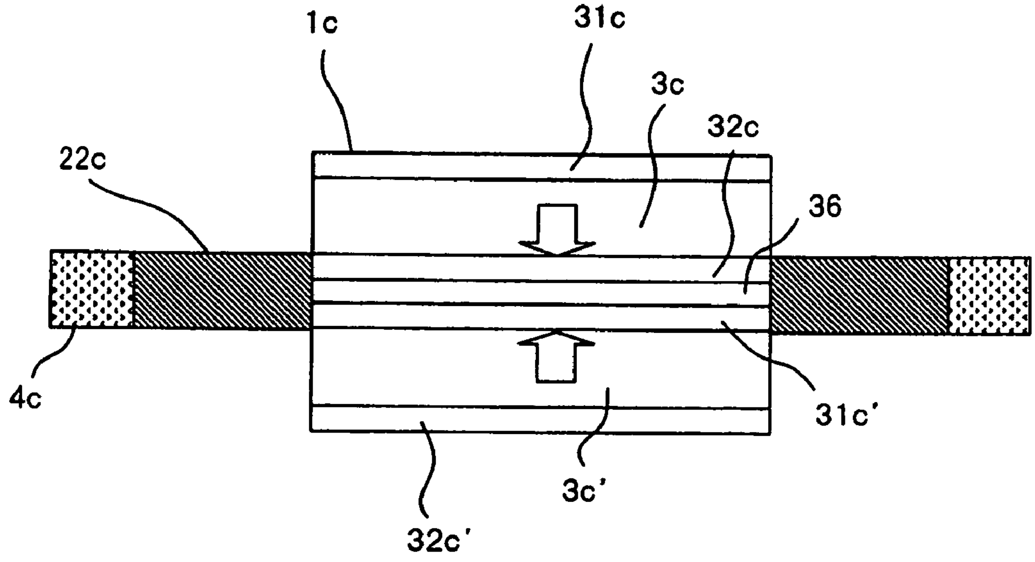
FIG. 5 is a conceptual cross-sectional view of a piezo-electric actuator according to a second embodiment of the present invention.
Figure 6:
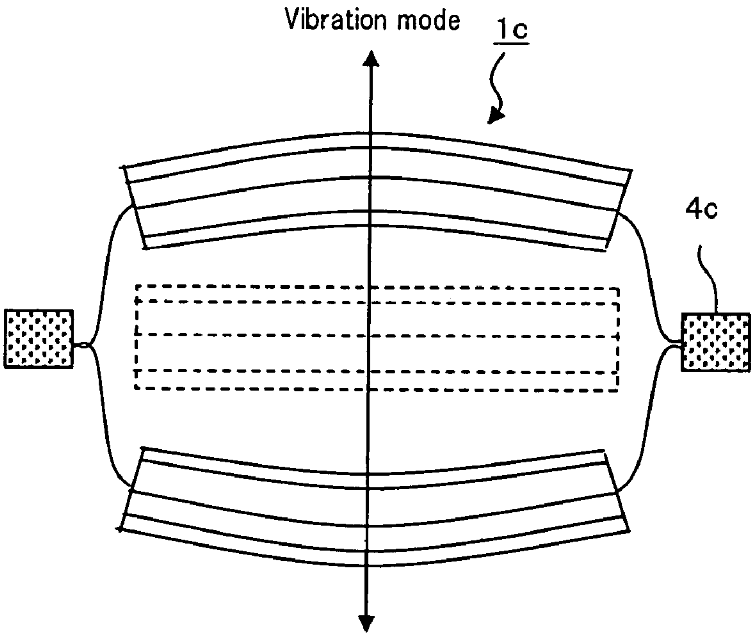
FIG. 6 is a conceptual diagram showing a vibration mode of the piezo-electric actuator illustrated in FIG. 5.

FIG. 5 illustrates a conceptual cross-sectional view of a piezo-electric actuator according to a second embodiment of the present invention. FIG. 6 illustrates a vibration mode of the piezo-electric actuator of this embodiment. A piezo-electric actuator which is formed by adhering together two piezo-electric bodies that are polarized in the thickness direction of the piezo-electric bodies is generally called a bimorph. This embodiment is an application of the concept of the present invention to a bimorph. As illustrated in FIG. 5, piezo-electric element 1*c* is a laminated structure in which upper piezo-electric body 3*c* and lower piezo-electric body 3*c*' are bonded, with insulating layer 36 sandwiched in between. More specifically, upper piezo-electric body 3*c* is sandwiched between upper electrode layer 31*c* and lower electrode layer 32*c*. Lower piezo-electric body 3*c*' is sandwiched between upper electrode layer 31*c*' and lower electrode layer 32*c*'. Insulating layer 36 is disposed between lower electrode layer 32*c* and upper electrode layer 31*c*'. In other words, this piezo-electric actuator has a second piezo-electric body which has lower piezo-electric body 3*c*', upper electrode layer 31*c*', and lower electrode layer 32*c*'. Further, upper piezo-electric body 3*c* and lower piezo-electric body 3*c*' are polarized in directions opposite to each other, as indicated by white arrows in the figure. In an alternative embodiment, base 21*a* may be used as insulating layer 36. Specifically, the piezo-electric actuator may have the structure that upper electrode layer 31*a*, piezo-electric body 3*a*, and lower electrode layer 32*a* are arranged in mirror symmetry under base 21*a* in the first embodiment.

As an AC electric field is applied to piezo-electric element 1*c*, either of upper piezo-electric body 3*c* or lower piezo-electric body 3*c*' expands while the other contracts, so that piezo-electric element 1*c* can perform self bending vibration through a mutual constraining effect between upper piezo-electric body 3*c* and lower piezo-electric body 3*c*', as illustrated in FIG. 6. Therefore, there is no need for a base in piezo-electric element 1*c* of this embodiment. Further, when the same AC voltage as the first embodiment is applied to each electrode, the field strength and the driving force doubles, respectively, and vibration amplitude quadruples.

Figure 7:
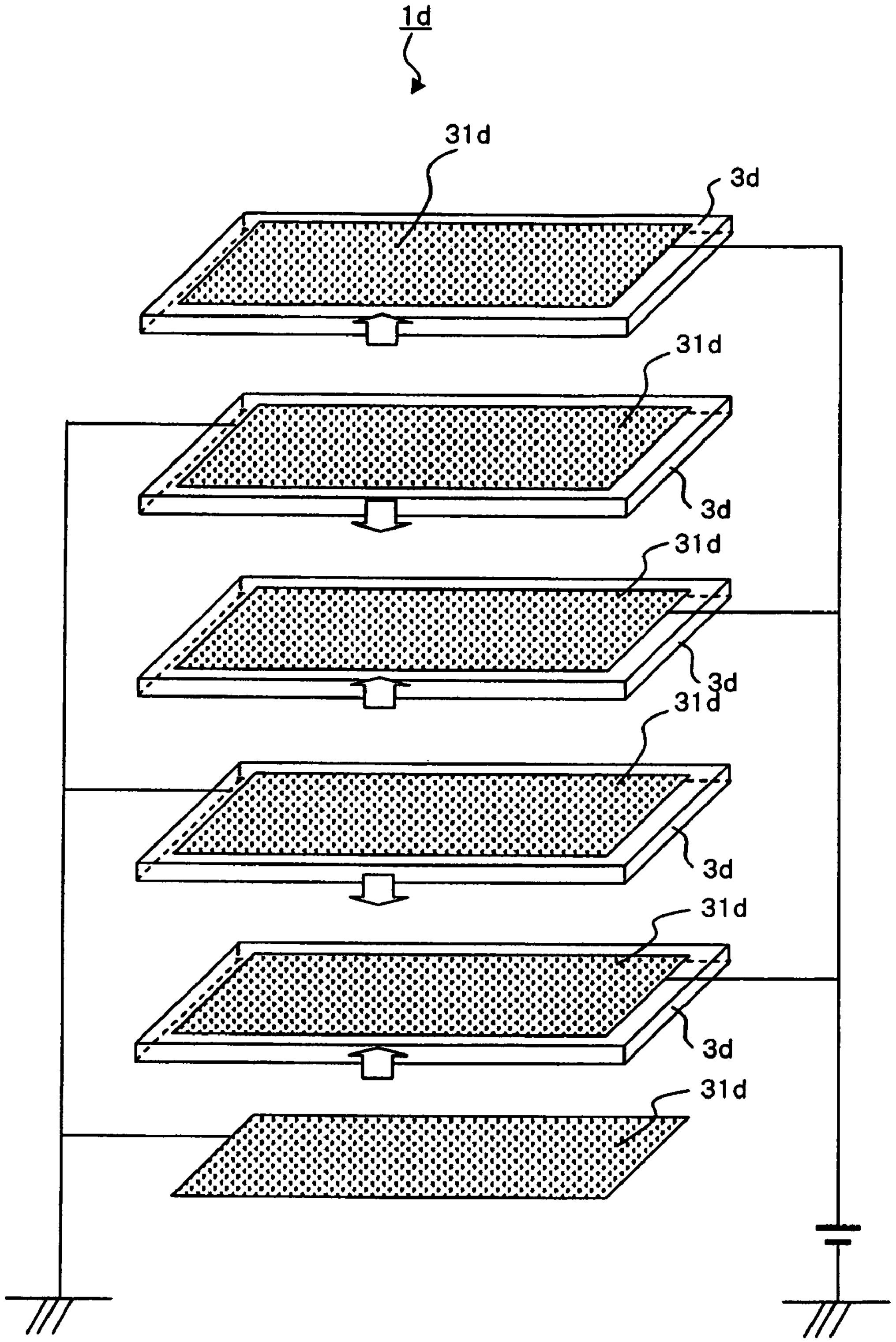
FIG. 7 is a conceptual cross-sectional view of a piezo-electric element according to a third embodiment of the present invention.

FIG. 7 illustrates a conceptual cross-sectional view of a piezo-electric actuator according to a third embodiment of the present invention. Though only piezo-electric elements are depicted, beam members and supporting members can be configured in a similar manner, for example, to the first embodiment. Piezo electric element 1*d* is formed in a laminated structure in which piezo-electric bodies 3*d* and electrode layers 31*d* are alternately laminated. Each piezo-electric body 3*d* is polarized in an alternately opposite direction, and also is electrically connected such that the electric fields are oriented in an alternately opposite direction. Thus, as electric fields are applied, all piezo-electric bodies 3*d* deform in the same manner, and as a result, the vibration amplitude increases in proportion to the number of piezo-electric body layers.

Figure 8:
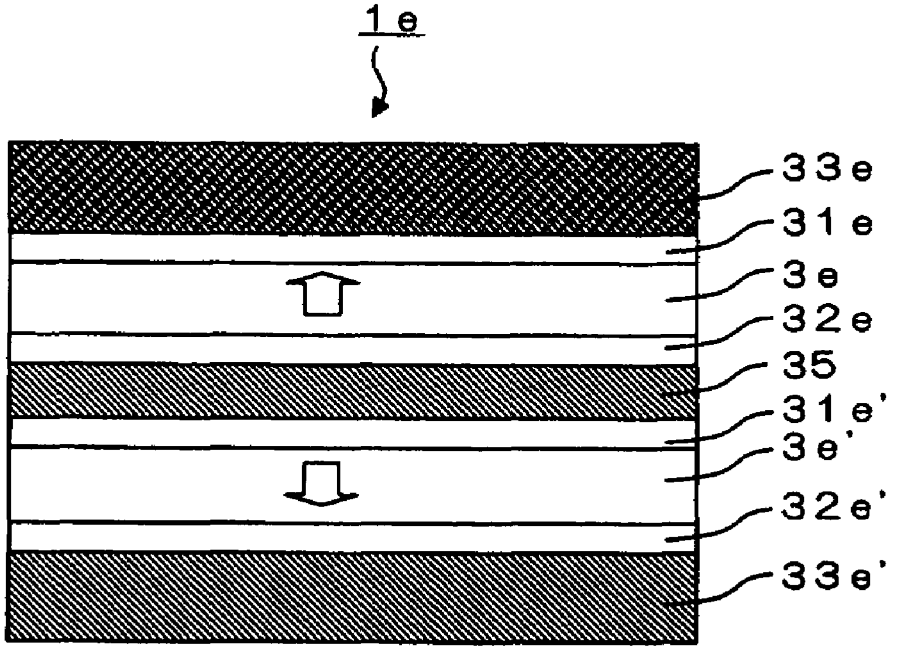
FIG. 8 is a conceptual cross-sectional view of a piezo-electric element according to a fourth embodiment of the present invention.

FIG. 8 illustrates a conceptual cross-sectional view of a piezo-electric actuator according to a fourth embodiment of the present invention. This embodiment is made by providing the second embodiment with insulating layers on both sides of piezo-electric bodies and in the central portion of the actuator. Specifically, upper piezo-electric body 3*e* is sandwiched between upper electrode layer 31*e* and lower electrode layer 32*e*, and lower piezo-electric body 3*e*' is sandwiched between upper electrode layer 31*e*' and lower electrode layer 32*e*'. Next, upper insulating layer 33*e* is disposed on upper electrode layer 31*e*, and lower insulating layer 33*e*' is disposed under lower electrode layer 32*e*'. Further, intermediate insulating layer 35 is disposed between lower electrode layer 32*e* and upper electrode layer 31*e*'. Such a layer configuration prevents electric leakage to the base even if a metal base is used for bonding, and allows for safe handling.

Figure 9:
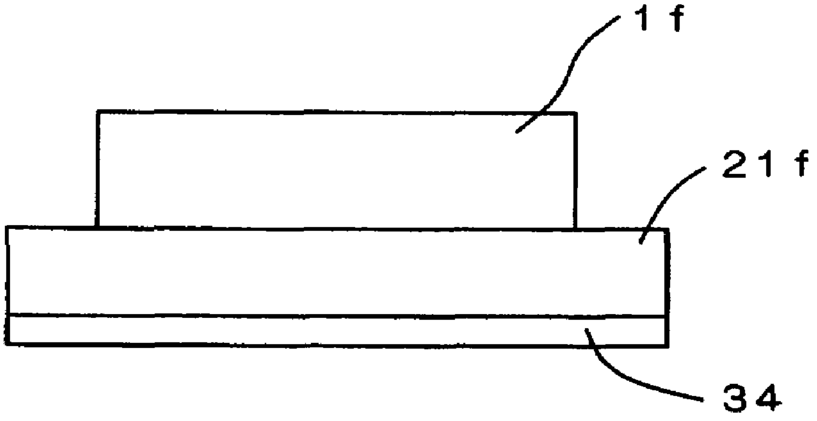
FIG. 9 is a conceptual cross-sectional view of a piezo-electric actuator according to a fifth embodiment of the present invention.

FIG. 9 illustrates a conceptual cross-sectional view of a piezo-electric actuator according to a fifth embodiment of the present invention. Piezo-electric element 1*f* of this embodiment includes vibrating film 34 that is bonded to the underside of base 21*f*. Paper or an organic film such as polyethylene terephthalate may be used as a base material for vibrating film 34. Vibrating film 34 suppresses sharp variation in vibration amplitude around the resonance frequency, making it possible to produce acoustic elements, such as a loud speaker and a receiver, with flat sound pressure and frequency characteristics. If an organic film, which is an insulating material, is used as a base material for vibrating film 34, a metal wire that is connected to piezo-electric element 21*f* can be formed on the base material by a plating technique or the like, so that the metal wire can be utilized as an electric terminal lead. This configuration improves reliability, as well, because electric conduction through electrode materials can be avoided. Alternatively, vibrating film 34 may be disposed between piezo-electric element 1*f* and base 21*f*.

A vibrating film may be bonded to base 21*f* via a material that transmits vibration such as rubber, foamed rubber or the like. Higher effects for flattening frequency characteristics can be accomplished. Alternatively, a plurality of piezo-electric actuators which differ in resonance frequency to each other may be bonded to a vibrating film for application to an electric device. The resulting acoustic device can exhibit a flat sound pressure over a wide range of frequencies.

EXAMPLES

In order to evaluate the effects of the present invention, the characteristics of the piezo-electric actuator of the present invention were evaluated based on the following Examples 1-9 and Comparative Examples 1-4. Evaluation Items are as follows.

(Evaluation 1) Measurement of resonance frequency: The resonance frequency was measured when 1V AC voltage was applied.

(Evaluation 2) Maximum amplitude of the vibration velocity: The maximum amplitude of the vibration velocity at the resonance frequency was measured when 1V AC voltage was applied.

Figure 10:
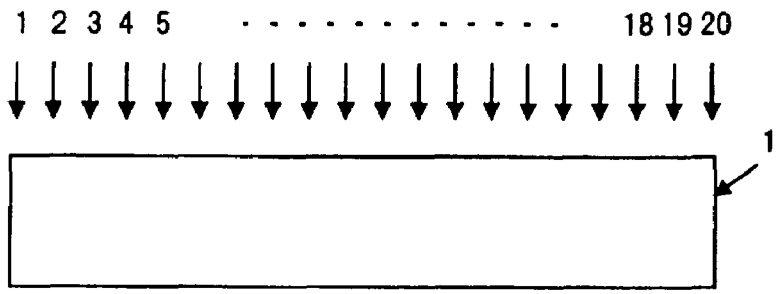
FIG. 10 is a diagram illustrating measured points of average amplitude of the vibration velocity.

(Evaluation 3) Average amplitude of the vibration velocity: As illustrated in FIG. 10, amplitudes of the vibration velocity were measured at 20 measured points (indicated by 1-20 in the figure) equally spaced in the longitudinal direction of piezo-electric element 1, and an average value for them was calculated.

Figure 11A:
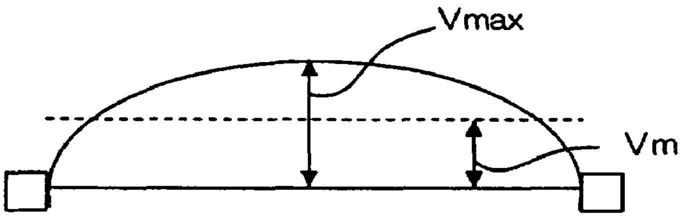
FIG. 11A is a diagram illustrating a vibration mode and a vibration velocity ratio.
Figure 11B:
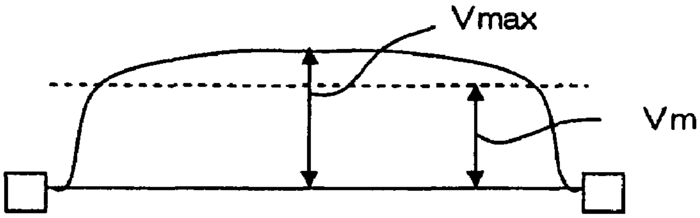
FIG. 11B is a diagram illustrating a vibration mode and a vibration velocity ratio.

(Evaluation 4) Vibration Mode: As illustrated in FIGS. 11A, 11B, a vibration mode was evaluated, using a vibration velocity ratio that is defined as the average amplitude of the vibration velocity Vm divided by maximum amplitude of the vibration velocity Vmax. Curves in the figures represent the distribution of vibration velocity amplitudes. A small vibration velocity ratio means a bending (arc-shaped) motion as shown in FIG. 11A. A large vibration velocity ratio means a reciprocal (piston-type) motion as shown in FIG. 11B. In this specification, motion was defined to be reciprocal when the vibration velocity ratio was 80% or more, while it was defined to be bending when the vibration velocity ratio was less than 80%.

(Evaluation 5) Q-value: The Q-value at the resonance frequency was measured when 1V AC voltage was applied. The frequency characteristic of sound pressure becomes flatter as the Q-value becomes lower.

(Evaluation 6) Measurement of sound pressure level: The sound pressure level was measured when 1V AC voltage was applied.

(Evaluation 7) Drop impact test: A cellular phone to which a piezo-electric actuator was mounted was dropped from just above 50 cm five times to perform a drop impact stability test. Specifically, a visual inspection was made for fractures such as cracks following the drop impact test, and additionally, sound pressure characteristic was measured after the test.

Example 1

Figure 12A:
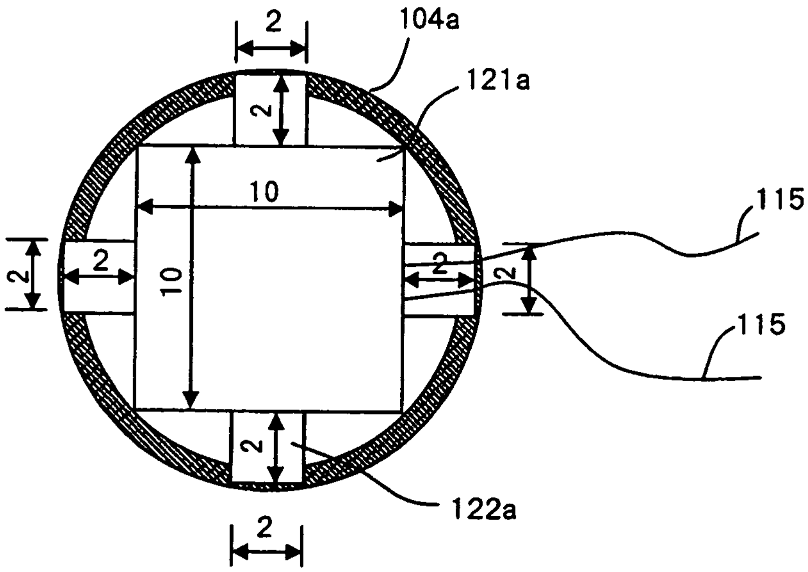
FIG. 12A is a plan view of a piezo-electric actuator according to Example 1.
Figure 12B:
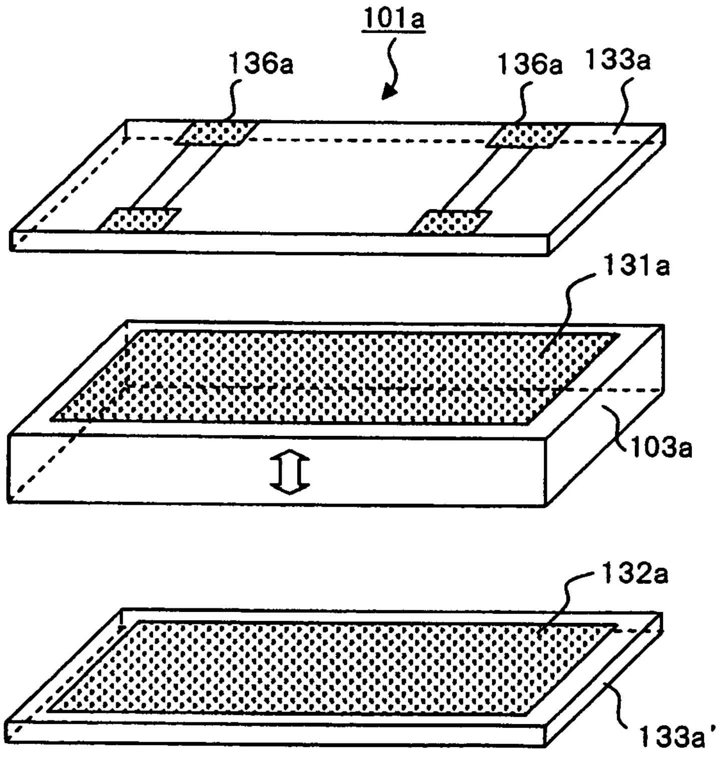
FIG. 12B is an exploded perspective view of the piezo-electric actuator according to Example 1.

A piezo-electric actuator illustrated in FIGS. 12A, 12B was fabricated. FIG. 12A illustrates a top plan view of a base, beam members, and a supporting member. Values in the figure are in units of millimeters. FIG. 12B in turn illustrates an exploded perspective view of the piezo-electric element. The piezo-electric actuator of Example 1 has piezo-electric element 101*a*, base 121*a*, supporting member 104*a*, and beam members 122*a*. Piezo-electric element 101*a* is bonded to base 121*a* with epoxy-based adhesive, while base 121*a* is connected to supporting member 104*a* via four beam members 122*a*.

As illustrated in FIG. 12B, piezo-electric element 101*a* is a single-layer type piezo-electric element consisting of upper insulating layer 133*a*, upper electrode layer 131*a*, piezo-electric body 103*a*, lower electrode layer 132*a*, and lower insulating layer 133*a*'. Upper insulating layer 133*a* and lower insulating layer 133*a*' have a length of 10 mm, a width of 10 mm, and a thickness of 50 μm. Piezo-electric body 103*a* has a length of 10 mm, a width of 10 mm, and a thickness of 300 μm. Upper electrode layer 131*a* and lower electrode layer 132*a* have each a thickness of 3 μm. Therefore, piezo-electric element 101*a* is in the form of a 10 mm square and has a thickness of approximately 0.4 mm.

Lead zirconate titanate based ceramic was used for piezo-electric body 103*a*, upper insulating layer 133*a*, and lower insulating layer 133*a*', while a silver/palladium alloy (in weight ratio of 70%:30%) was used for upper electrode layer 131*a* and lower electrode layer 132*a*. The piezo-electric element was manufactured by a green sheet method, and was sintered at 1100° C. for two hours in the atmosphere. Then, silver electrodes with a thickness of 8 μm were formed as external electrodes that were connected to the electrode layers, then piezo-electric body 103*a* was polarized. Then electrode pads 136*a* that were formed on the surface of upper insulating layer 133*a* were connected together by copper foils with a thickness of 8 μm, then two electrode terminal lead lines 115 with a diameter of 0.2 mm were bonded to the pads through solder portions (not shown) having a diameter of 1 mm and a height of 0.5 mm.

Base 121*a* is made of phosphor bronze with a thickness of 0.05 mm. Base 121*a* was formed into the shape shown in FIG. 12A through cutting. Four beam members 122*a* attached to base 121*a* are made of SUS304, and all members have the same shape with a width of 4 mm, a length of 4 mm, and a thickness of 0.2 mm. Beam members 122*a* are connected to annular supporting member 104*a*.

The piezo-electric actuator of this example fabricated in the foregoing manner is a small and thin piezo-electric actuator in a circular shape having a diameter of 16 mm and a thickness of 0.45 mm. This piezo-electric actuator provided a reciprocal vibration mode as illustrated in FIG. 11B, with a resonance frequency of 529 HZ, a maximum amplitude of the vibration velocity of 180 mm/s, and a maximum vibration velocity ratio of 0.83.

Comparative Example 1

Figure 13:
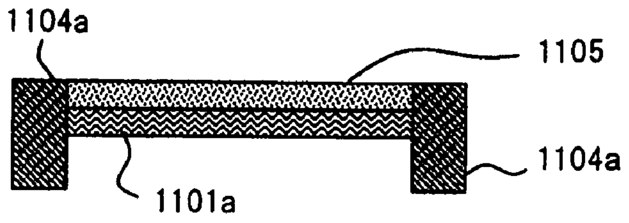
FIG. 13 is a conceptual cross-sectional view of a piezo-electric actuator according to Comparative Example 1.

In order to confirm the effects of Example 1, a conventional piezo-electric actuator illustrated in FIG. 13 was fabricated. Piezo-electric element 1101*a* having a length of 16 mm, a width of 8 mm, and a thickness of 0.4 mm was fabricated in a way similar to Example 1, then metal plate 1105 (phosphor bronze, with a thickness of 0.1 mm) was bonded to fabricate the piezo-electric actuator, then both ends were connected by supporting member 1104*a*.

The fabricated piezo-electric actuator provided an arc-shaped vibration mode as illustrated in FIG. 11A, with a resonance frequency of 929 HZ, a maximum amplitude of the vibration velocity of 1480 mm/s, and a maximum vibration velocity ratio of 0.47.

It was confirmed from the comparison between Example 1 and Comparative Example 1, that a piezo-electric actuator having a low resonance frequency, large vibration amplitude, and a flat vibration amplitude can be provided.

Example 2

Figure 14:
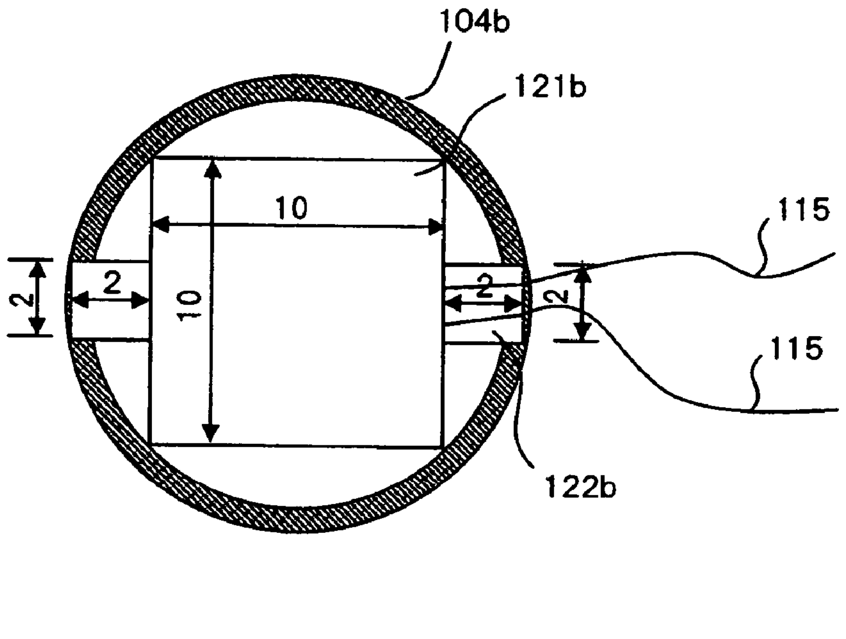
FIG. 14 is a plan view of a piezo-electric actuator according to Example 2.

The piezo-electric actuator of Example 2 has base 121*b*, supporting member 104*b*, and beam members 122*b*. In Example 2, the number of beam members 122*b* attached to the base was changed from four in Example 1 to two in order to confirm the degree of reduction in the resonance frequency. As illustrated in FIG. 14, conditions were the same as in Example 1 except for the number of beam members 122*b*. The piezo-electric actuator had a circular form having a diameter of 16 mm and a thickness of 0.45 mm. Values in the figure are in units of millimeters. The piezo-electric actuator provided a reciprocal vibration mode, with a resonance frequency of 498 HZ, a maximum amplitude of the vibration velocity of 172 mm/s, and a maximum vibration velocity ratio of 0.86.

It was confirmed from the comparison between Examples 1 and 2, that the resonance frequency can be lowered by changing the number of beam members without causing a large change in the vibration mode or in the vibration velocity amplitude.

Example 3

In Example 3, the configuration of Example 2 was used, while the material of the base was changed from phosphor bronze to SUS304. The other conditions are the same as in Example 2. The piezo-electric actuator provided a reciprocal vibration mode, with a resonance frequency of 572 HZ, and a maximum amplitude of the vibration velocity of 189 mm/s.

It was confirmed from the comparison between Examples 2 and 3, that the resonance frequency can be adjusted by changing the material of the base without causing a large change in the shape, vibration mode, and maximum amplitude of the vibration velocity of the actuator.

Example 4

Figure 15:
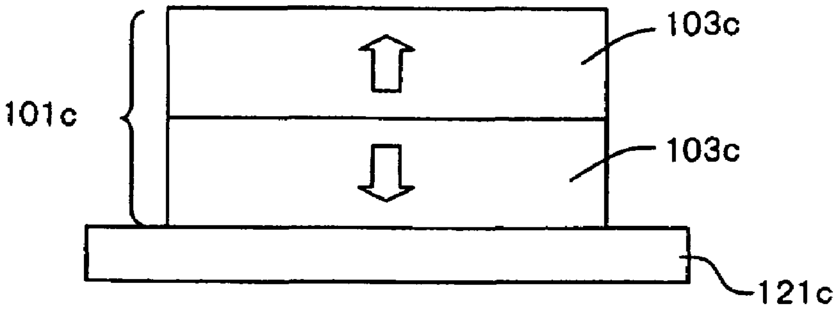
FIG. 15 is a conceptual cross-sectional view of a piezo-electric element according to Example 4.

In Example 4, a bimorph type piezo-electric actuator was fabricated using two piezo-electric elements which differed in vibrating direction. As illustrated in FIG. 15, the piezo-electric actuator of Example 4 has a base 121*c* and piezo-electric element 101*c* which has piezo-electric bodies 103*c*, 103*c*' which are in the same shape and are bonded such that they vibrate in different directions. Piezo-electric bodies 103*c*, 103*c*' are in the form of a 10 mm square having a thickness of 0.2 mm. Therefore, piezo-electric element 101*c* is the same as Example 2 in shape. Also, the configuration except for the piezo-electric element is the same as Example 2.

The piezo-electric actuator provided a reciprocal vibration mode, with a resonance frequency of 487 HZ, and a maximum amplitude of the vibration velocity of 352 mm/s.

It was confirmed from the comparison between Examples 2 and 4, that the maximum vibration displacement can be largely increased by using a bimorph type piezo-electric element which has two piezo-electric plates that are bonded together and vibrate in different directions.

Example 5

Figure 16:
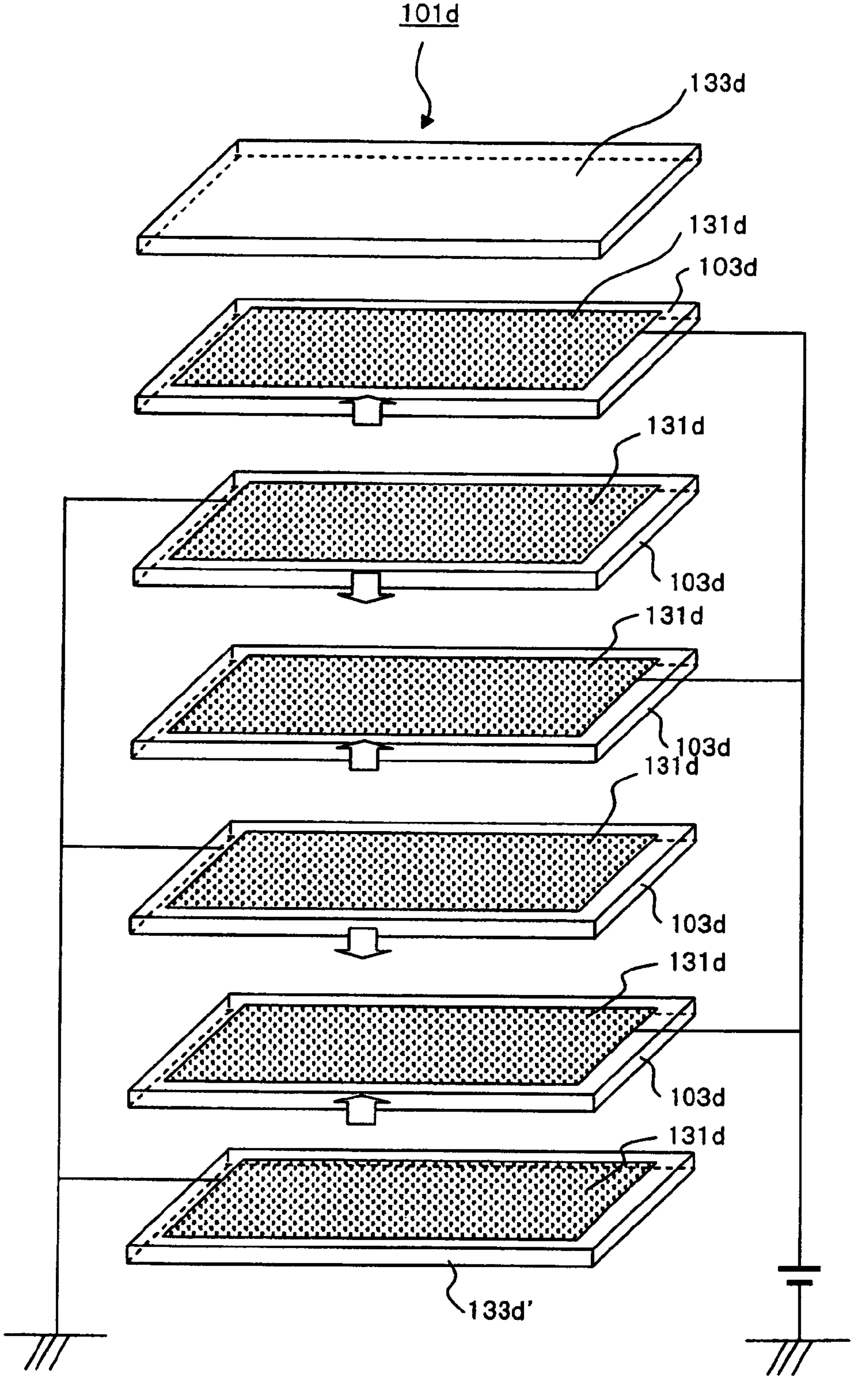
FIG. 16 is an exploded perspective view of a piezo-electric element according to Example 5.

In Example 5, the piezo-electric element was changed from the single type in Example 2 to laminated layers. The laminate type piezo-electric element 101*d* of this example is a three-layer type. As illustrated in FIG. 16, it consists of upper insulating layer 133*d*, four electrode layers 131*d*, three piezo-electric bodies 103*d*, and lower insulating layer 133*d*' which are laminated. Upper insulating layer 133*d* and lower insulating layer 133*d*' are in the form of a 10 mm square with a thickness of 80 .mu.m. Piezo-electric bodies 103*d* are in the form of a 10 mm square with a thickness of 80 .mu.m. Electrode layers 131*d* are in the form of a 10 mm square with a thickness of 3 .mu.m. Therefore, piezo-electric element 101*d* is in the form of a 10 mm square having a thickness of approximately 0.4 mm. Further, the piezo-electric actuator has a circular shape with a diameter of 16 mm and a thickness of 0.45 mm, which is the same as Example 2.

Lead zirconate titanate based ceramic was used for upper insulating layer 133*d*, lower insulating layer 133*d*', and piezo-electric bodies 103*d*, while a silver/palladium alloy (in weight ratio of 70%:30%) was used for electrode layers 131*d*. The piezo-electric element 104*d* was manufactured by a green sheet method, and was sintered at 1100° C. for two hours in the atmosphere. Then, similar to FIG. 12, silver electrodes that were connected to the electrode layers were formed, then piezo-electric bodies 103*d* were polarized. Then electrode pads, not shown, that were formed on the surface of upper insulating layer 133*d* were connected together by copper foils.

The piezo-electric actuator provided a reciprocal vibration mode with a resonance frequency of 495 HZ, and a maximum amplitude of the vibration velocity of 518 mm/s.

It was confirmed from the comparison between Examples 2 and 5, that the maximum amplitude of the vibration velocity can be largely increased by using a piezo-electric element in a laminated structure without causing change in the resonance frequency.

Example 6

Figure 17:
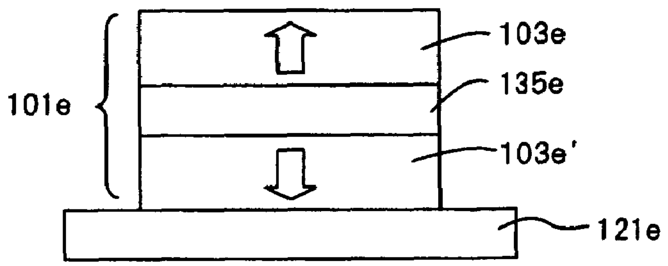
FIG. 17 is a conceptual cross-sectional view of a piezo-electric element according to Example 6.

In this example, insulating layer 135*e* was disposed between two piezo-electric plates of the bimorph piezo-electric element of Example 4, as illustrated in FIG. 17. A polyethylene terephthalate (PET) film with a thickness of 0.1 mm was used for insulating layer 135*e* disposed between the two piezo-electric plates 103*e* and 103*e*' of the bimorph piezo-electric element 101*e*. The piezo-electric element as illustrated in FIG. 17 also has base 121*e*. The configuration of Example 6 is the same as that of Example 4, except that insulating layer 135*e* was added. The thickness of the piezo-electric actuator of this example is 0.55 mm which represents an increase of 0.1 mm as compared with Example 2, due to the thickness of insulating layer 135*e*.

The piezo-electric actuator provided a reciprocal vibration mode with a resonance frequency of 442 HZ, and a maximum amplitude of the vibration velocity of 186 mm/s. Further, none of the 50 samples that were manufactured under the same conditions presented electric leakage, thus safety handling was confirmed.

It was confirmed from the comparison between Example 4 and 6, that a piezo-electric actuator with large vibration displacement, which suppresses electric leakage even when a metal base is used and can be safely handled, is provided by inserting an insulating layer in the piezo-electric element.

Example 7

Figure 18:
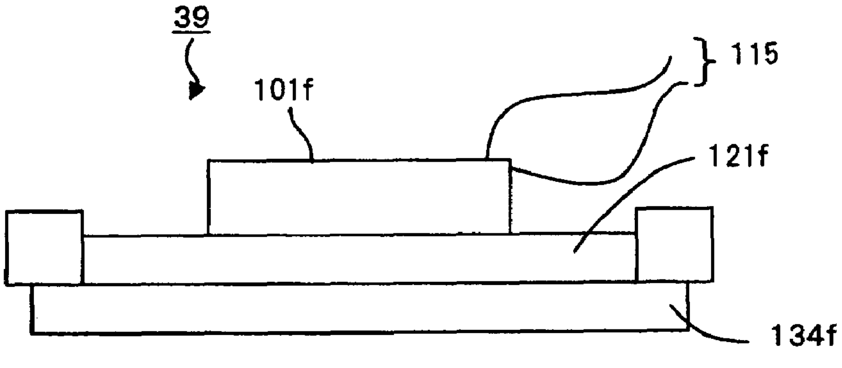
FIG. 18 is a conceptual cross-sectional view of an acoustic element according to Example 7.

As illustrated in FIG. 18, in this example, vibrating film 134*f* was bonded to the piezo-electric actuator of Example 2 to create acoustic element 39, which then was operated to radiate sound by the vibration that was transmitted to vibrating film 134*f*. Specifically, vibrating film 134*f* made of a polyethylene terephthalate (PET) film with a thickness of 0.05 mm was attached to the back side of base 121*f*. The piezo-electric actuator illustrated in FIG. 18 comprises the piezo-electric element 101*f*.

The acoustic element presented a resonance frequency of 483 HZ, Q-value of 8.76, and a sound pressure level of 98 dB.

Comparative Example 2

Figure 19:
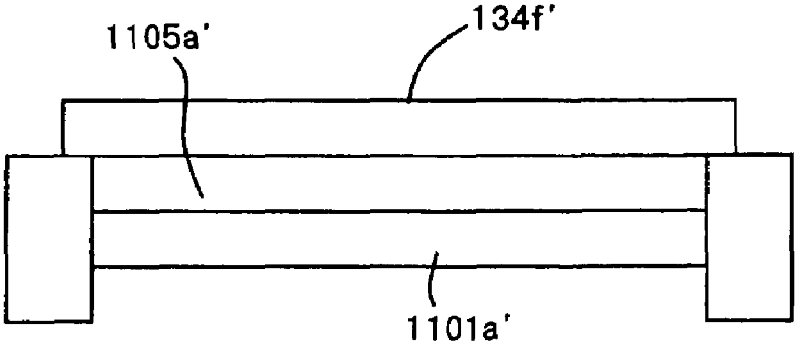
FIG. 19 is a conceptual cross-sectional view of an acoustic element according to Comparative Example 2.

In order to compare the effects of the piezo-electric actuator of Example 7, a conventional piezo-electric acoustic element was fabricated, as illustrated in FIG. 19. This acoustic element has a piezo-electric element 1101*a*', a metal plate 1105*a*', and vibrating film 134*f* that is similar to that of Example 7, and was attached to the piezo-electric actuator (see FIG. 13) of Comparative Example 1. The fabricated acoustic element presented a resonance frequency of 796 HZ, a Q-value of 37, and a sound pressure level of 79 dB.

It was confirmed from the comparison between Example 7 and Comparative Example 2, that an acoustic element can be provided that has a wide frequency range, the flat frequency characteristic of sound pressure, and a high sound pressure level.

Example 8

Figure 20A:
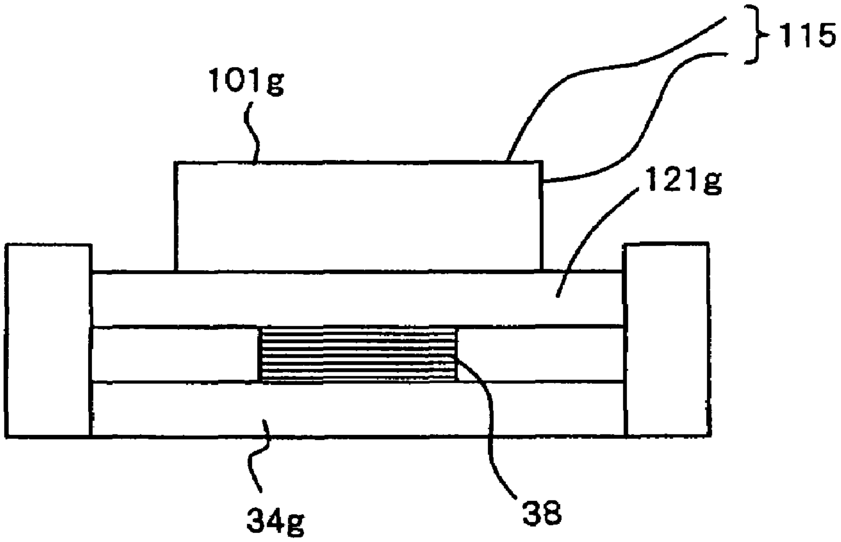
FIG. 20A is a conceptual cross-sectional view of an acoustic element according to Example 8.
Figure 20B:
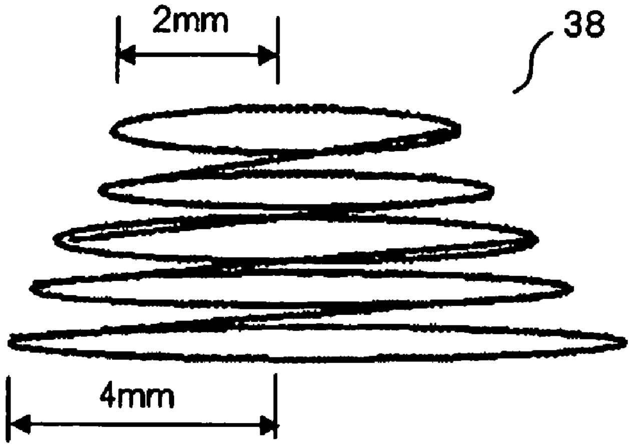
FIG. 20B is a conceptual diagram of a coil spring in the acoustic element according to Example 8.

In this example, as illustrated in FIG. 20A, conical coil spring 38 was interposed as a vibration transmitting member between piezo-electric element 101*g* and vibrating film 34*g* of acoustic element 39 of Example 7. Coil spring 38 has a thickness of 0.2 mm, a minimum coil radius of 2 mm, and a maximum coil radius of 4 mm, and is formed of a stainless steel wire, as illustrated in FIG. 20B. Coil spring 38 is bonded to base 121*g* at the minimum coil radius plane, and is bonded to vibrating film 34*g* at the maximum coil radius plane with epoxy-based adhesive. This example has the same configuration as that of Example 7 except that coil spring 38 is provided. The acoustic element of Example 7 has a thickness of 0.7 mm, by adding the thickness of coil spring 38, i.e., 0.2 mm to the thickness of the element of Example 2.

The fabricated acoustic element presented a resonance frequency of 457 HZ, a Q-value of 9.8, and a sound pressure level of 108 dB.

It was confirmed from the comparison between Examples 7 and 8, that the resonance frequency can be lowered while the sound pressure level can be increased by interposing a vibration transmitting member between the vibrating film and the piezo-electric actuator.

Example 9

Figure 21:
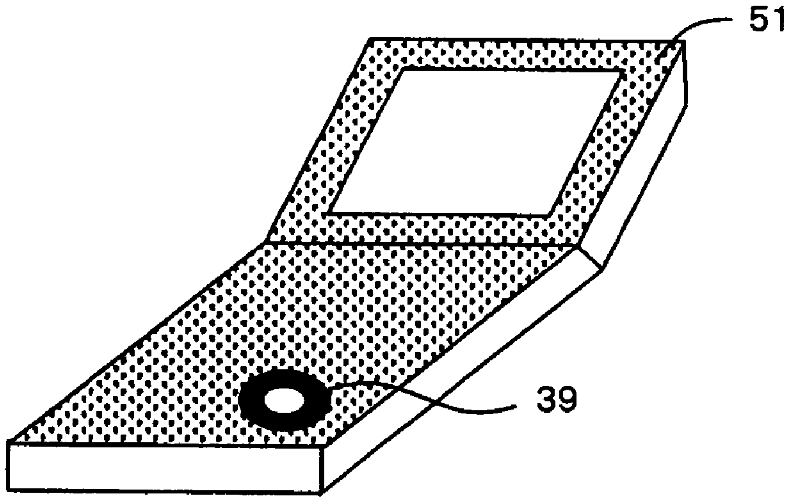
FIG. 21 is a diagram illustrating an acoustic element according to Example 8 that is installed in a cellular phone.

As illustrated in FIG. 21, acoustic element 39 of Example 7 was mounted in cellular phone 51, then the sound pressure level and the frequency characteristic of sound pressure of acoustic element 39 was measured at a distance of 30 cm. The resonance frequency was 501 HZ, the frequency characteristic of sound pressure was flat, the Q-value was 8.12, and the sound pressure level was 95 dB. Further, as a result of a drop impact test, no cracks were found in the piezo-electric element even after dropping five times, and the sound pressure level was found to be 94 dB after the test.

Comparative Example 3

The piezo-electric acoustic element of Comparative Example 2 was mounted in cellular phone 51. The sound pressure level and the frequency characteristic of sound pressure of the acoustic element were measured at a distance of 30 cm in a manner similar to that in Example 9. The resonance frequency was 821 HZ, the frequency characteristic of sound pressure was very rough, and the sound pressure level was 75 dB. As the result of a drop impact test, a crack was found in the piezo-electric element after dropping cellular phone 51 twice, and the sound pressure was found to be 60 dB or lower at that time.

It was confirmed from the comparison between Example 9 and Comparative Example 3, that a cellular phone can be provided that reproduces sound over a wide frequency range with large sound pressure and flat frequency characteristic of sound pressure, by mounting the acoustic element of Example 9 in the cellular phone. It was also confirmed that the acoustic element of the present invention has a resistance to damage when dropped.

Comparative Example 4

Figure 22:
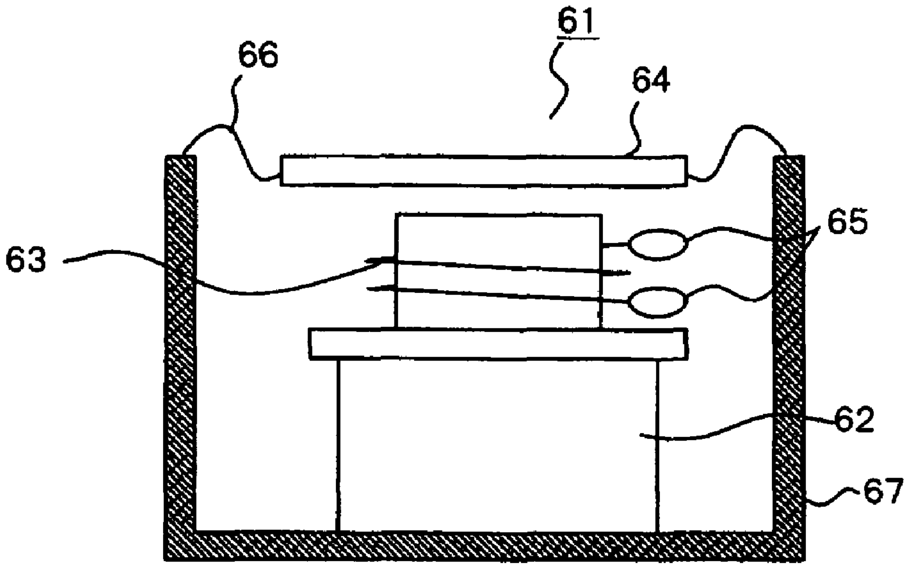
FIG. 22 is a conceptual cross-sectional view of an acoustic element according to Comparative Example 4.

As illustrated in FIG. 22, electromagnetic acoustic element 61 was mounted in a cellular phone. The acoustic element of this comparative example has permanent magnet 62, voice coil 63, and diaphragm 64. A magnetic force was generated by voice coil 63 when a current was applied from electric terminal 65. Diaphragm 64 was repeatedly attracted and repulsed by the generated magnetic force to generate a sound. Diaphragm 64 is connected to housing 67 by coupling member 66 at the periphery. The acoustic element of Comparative Example 4 has a circular shape having a diameter of 20 mm and a thickness of 2.5 mm. Sound pressure level and frequency characteristic of sound pressure of the acoustic element were measured at a distance of 30 mm in a manner similar to that of Example 9. The resultant resonance frequency was 730 HZ, and the sound level was 73 dB.

It was confirmed from the comparison between Example 9 and Comparative Example 4, that reproduction of sound over a wider frequency range with higher sound pressure as compared with the conventional electromagnetic acoustic element can be provided by mounting the acoustic element of the present invention in a cellular phone.

As described above in detail in BEST MODE FOR CARRYING OUT THE INVENTION, and in the results of Examples 1-9 and Comparative Examples 1-4, the present invention provides a piezo-electric actuator which is thin and small, is capable of providing large vibration amplitude, is adjustable for resonance frequency without changing the outer dimensions, and has high reliability, so that it can be applied to a wide range of electronic devices and so on.

The invention claimed is:

1. A piezo-electric actuator comprising:

a piezo-electric element having a piezo-electric body which is provided with at least two opposing surfaces, wherein the surfaces perform an expanding and contracting motion in accordance with a state of an electric field;

a constraint member for constraining the piezo-electric element on at least one of the two surfaces, a supporting member disposed around the constraint member, but not below the constraint member, and a plurality of beam members each having both ends that are fixed to the constraint member and the supporting member, respectively, wherein each beam member has a neutral axis for bending in a direction substantially parallel with the constrained surface, wherein the constraint member vibrates by vibration which is generated by constraining effect between the constraint member and the piezo-electric element, and is amplified by the beam members, wherein said beam members are straight beams, wherein said beam members are made of resin, wherein the constraint member and the plurality of beam members comprise an integrated unit, and wherein a vibrating film made of polyethylene terephthalate (PET) is attached to the integrated unit.

2. The piezo-electric actuator according to claim 1, wherein said constraint member has a base for constraining said piezo-electric element, and a plurality of arms that extend from said base to constitute said beam members.

3. The piezo-electric actuator according to claim 1, wherein said constraint member is a second piezo-electric element which differs in vibrating direction from said piezo-electric body.

4. The piezo-electric actuator according to claim 1, wherein said piezo-electric element comprises a plurality of said piezo-electric bodies and a plurality of electrode layers for applying an electric field to said piezo-electric bodies, wherein each piezo-electric body and each electrode layer is alternately laminated.

5. The piezo-electric actuator according to claim 1, wherein said piezo-electric element is provided with an insulating layer on at least one of said two surfaces.

6. The piezo-electric actuator according to claim 1, wherein said piezo-electric element has a rectangular parallelepiped shape.

7. An acoustic element comprising:

the piezo-electric actuator according to claim 1; and wherein the vibrating film is attached to the integrated unit for radiating sound through vibration that is transmitted from said piezo-electric actuator.

8. The acoustic element according to claim 7, further comprising a vibration transmitting member sandwiched between said integrated unit and said vibrating film.

9. An electronic device comprising the piezo-electric actuator according to claim 1.

10. An electronic device comprising the acoustic element according to claim 7.

11. An acoustic apparatus comprising a plurality of said acoustic elements according to claim 7 which have resonance frequencies different from each other for smoothing frequency response of sound pressure.

12. An electronic device comprising said acoustic apparatus according to claim 11.

13. The piezo-electric actuator according to claim 1, wherein the constraint member is made of metal or resin.

14. The piezo-electric actuator according to claim 1, wherein at least two beam members extend radially from the center of the constraint member.

* * * * *